US007486142B2

United States Patent
Tsurumaki et al.

(10) Patent No.: US 7,486,142 B2
(45) Date of Patent: Feb. 3, 2009

(54) RADIO FREQUENCY POWER AMPLIFYING MODULE WITH HETERO JUNCTION BIPOLAR TRANSISTOR

(75) Inventors: Hirokazu Tsurumaki, Tokyo (JP); Hiroyuki Nagai, Tokyo (JP); Tomio Furuya, Tokyo (JP); Yoshiaki Harasawa, Tokyo (JP); Makoto Tabei, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 90 days.

(21) Appl. No.: 11/618,197

(22) Filed: Dec. 29, 2006

(65) Prior Publication Data
US 2007/0194852 A1 Aug. 23, 2007

(30) Foreign Application Priority Data
Feb. 17, 2006 (JP) ............................. 2006-040080

(51) Int. Cl.
*H03G 3/30* (2006.01)
(52) U.S. Cl. ........................ 330/285; 330/296; 330/307
(58) Field of Classification Search .................. 330/66, 330/285, 296, 307
See application file for complete search history.

(56) References Cited

U.S. PATENT DOCUMENTS 7,345,547 B2 * 3/2008 Wang et al. .................. 330/285

OTHER PUBLICATIONS

"GaAs Heterojunction Bipolar Transistor Device and IC Technology for High-Performance Analong and Microwave Applications" by Kim, et al., IEEE Transactions on Microwave Theory and Techniques, vol. 37, No. 9, Sep. 1989.1286-1303.

* cited by examiner

*Primary Examiner*—Khanh V Nguyen
(74) *Attorney, Agent, or Firm*—Mattingly, Stanger, Malur & Brundidge, P.C.

(57) ABSTRACT

The present invention is directed to compensate electric properties of an RF power module depending on changes with time, temperature dependency, variations, and the like of grounded emitter current amplification factor of an HBT. A compound semiconductor integrated circuit supplies reference current of a reference HBT depending on hFE of an HBT to an input terminal of a first current mirror of a bias circuit of a silicon semiconductor integrated circuit. The base of an output HBT of the compound semiconductor integrated circuit is biased with bias current which increases in response to decrease in hFE of the HBT from an output of the first current mirror of the silicon semiconductor integrated circuit.

9 Claims, 5 Drawing Sheets

ΔhFE (@Ice=0.2kA/cm²)

RADIO FREQUENCY POWER AMPLIFYING MODULE WITH HETERO JUNCTION BIPOLAR TRANSISTOR

CROSS-REFERENCE TO RELATED APPLICATION

The present application claims priority from Japanese patent application No. 2006-40080 filed on Feb. 17, 2006, the content of which is hereby incorporated by reference into this application.

BACKGROUND OF THE INVENTION

The present invention relates to an RF power module with a hetero junction bipolar transistor used for power amplification of radio frequency and, more particularly, to a technique useful for compensating properties of an RF power module depending on a property variation in a hetero junction bipolar transistor.

Hitherto, in a hetero junction bipolar transistor (hereinbelow, called HBT), a hetero junction is used for an emitter-base junction of a bipolar transistor, and a band gap of the emitter is made larger than that of a base region. As a result, in the HBT, the amount of minority carriers injected from the base to the emitter is small and, while maintaining the emitter injection efficiency high, the base impurity concentration can be made high. Therefore, low internal base resistance can be achieved, and cut-off frequency fT can be improved largely as compared with that in the conventional bipolar transistor.

In M. E. Kim et al., "GaAs Heterojunction Bipolar Transistor Device and IC Technology for High-Performance Analog and Microwave Applications", IEEE Transactions on Microwave Theory and Techniques, Vol. 37, No. 9, September 1989, pp. 1286-1303, the reliability of an HBT with a compound semiconductor hetero junction of GaAs/AlGaAs is discussed. In particular, it is reported that deterioration in device parameters such as current amplification factor of an HBT suggests deterioration related to a base-emitter space charge region which may be contamination, surface leak related to ohmic metal, or device short-circuit.

Since the current amplification factor β of a bipolar transistor made of silicon has positive temperature dependency, the grounded emitter current amplification factor increases with temperature rise. It is also written in the document that the grounded emitter current amplification factor of an HBT has negative temperature dependency, and the grounded emitter current amplification factor decreases with temperature rise.

SUMMARY OF THE INVENTION

Prior to the present invention, the inventors of the present invention engaged in development of an RF power module for use in a cellular phone. A power amplifier to be mounted on the RF power module uses an HBT as a power amplifying transistor. FIG. 6 is a diagram showing changes with time of a grounded emitter current amplification factor hFE as one of important device parameters in the electric parameters of the HBT. In the diagram, collector current density Ice is measured as relatively high current density of 0.2 KA/cm2. The axis of ordinates shows a value obtained by dividing lapsed value hFE(t) of the grounded emitter current amplification factor hFE after lapse of predetermined test time by the initial value hFE(0) of the grounded emitter current amplification factor hFE and showing the obtained value in percentage. The axis of abscissa denotes test time in time units. From the diagram, it is understood that devices in which the grounded emitter current amplification factor hFE of the HBT drops 10% or more in operation of 20 hours of relatively high current density are also included. When devices of HBT are mass-produced, a device having large changes with time in the grounded emitter current amplification factor hFE and a device having relatively small changes with time are included.

A method of screening an HBT having large changes with time in the grounded emitter current amplification factor hFE by an accelerated test at the time of mass device production has been also examined. As a result, a problem was also found that when the degree of variations in the changes with time is considered, test time of the accelerated test for screening cannot be determined.

In an RF power module for use in a cellular phone, an automatic power control (APC) for controlling the value of transmission power of the RF power module in proportional to a communication distance between a base station and a cellular phone is performed. In the APC, bias voltage of a power amplifying transistor is controlled with APC voltage Vapc to thereby set transmission power at a desired level. The transmission power level of the RF power module is detected by an output power detector. A power detection signal is compared with a lamp voltage Vramp as a transmission power level instruction signal supplied from a baseband signal processing unit such as a baseband LSI via an RF analog signal processing unit such as an RF IC. From a comparison result, the APC voltage Vapc is generated. The APC voltage Vapc performs a feedback-control on the bias voltage of the power amplifying transistor so that the power detection signal matches the lamp voltage Vramp. Consequently, the desired transmission power level can be set.

However, variations in the value of the grounded emitter current amplification factor hFE of the HBT in the RF power module cause variations in the bias direct current of the power amplifying transistor with respect to the APC voltage Vapc. The transmission power itself of the RF power module is accurately set to a desired level in accordance with the lamp voltage Vramp by employing the APC negative feedback control. It was found that, however, variations in the bias direct current of the power amplifying transistor cause variations in the power consumption of the RF power module As described in the beginning, the grounded emitter current amplification factor of an HBT has negative temperature dependency. Therefore, when the temperature of the HBT rises with temperature rise caused by increase in the transmission power of the RF power module, the grounded emitter current amplification factor hFE of an HBT decreases. Then, the transmission power level of the RF power module drops. To recover the dropped transmission power level, the APC voltage Vapc increases. At this time, the bias direct current of the power amplifying transistor increases, and it causes a problem such that power consumption of the RF power module increases.

The inventors of the present invention have made examinations as follows prior to the present invention. In an RF power module at the examination stage, a reference hetero junction bipolar transistor is formed on a compound semiconductor chip of a compound semiconductor integrated circuit on which an output hetero junction bipolar transistor as a power amplifying transistor for outputting a transmission output signal is formed. Since the output HBT and the reference HBT are formed on the compound semiconductor chip by the same process, changes with time, temperature dependency, variations, and the like of the grounded emitter current amplification factor of the output HBT and those of the reference HBT are almost the same. Therefore, the reference HBT functions as a replica device for monitoring changes with time, temperature dependency, variations, and the like of the grounded emitter current amplification factor of the output HBT. By supplying reference current of the reference HBT depending on the value of the grounded emitter current amplification factor to the input of a compensation circuit in the compound semiconductor chip, output bias current which is inverse proportional to the value of the grounded emitter current amplification factor is supplied from the output of the compensation circuit to the base of the output HBT. As a result, even if the grounded emitter current amplification factor hFE of the output FBT decreases, the collector current of the output HBT is maintained almost constant. Since the bias current which is inverse proportional to the value of the grounded emitter current amplification factor from the output of the compensation circuit increases with the decrease in the grounded emitter current amplification factor hFE, the collector current of the output HBT can be maintained almost constant.

In the case of forming an NPN-type HBT and a PNP-type HBT having a complementary relation by HBTs made of a compound semiconductor such as GaAs/AlGaAs, generally, the output HBT is an NPN-type HBT, so that a reference HBT is also an NPN-type HBT. Therefore, the reference current of the reference HBT as a replica device is inflow current which flows in the ground potential via the reference HBT. On the other hand, the output bias current from the output of the compensation circuit to be supplied to the base of the output HBT is outflow current which flows from the power source voltage via the compensation circuit. Generally, to generate the outflow current from the inflow current, a current mirror constructed by PNP-type bipolar transistors is used. When the HBTs made of the compound semiconductor such as GaAs/AlGaAS are used, it is difficult to integrate the NPN-type HBT and the PNP-type HBT having the complementary relation on a single chip due to limitation of complicated material processes.

For the output HBT in the RF power module, the APC bias control as described above is necessary. For the output HBT, compensation bias control for reducing the influence of changes with time of the grounded emitter current amplification factor, temperature dependency, variations, and the like is also necessary. Therefore, the compensation bias control has to have consistency with the APC bias control.

The present invention has been achieved on the basis of results of examinations made prior to the present invention by the inventors herein. Therefore, a main object of the present invention is to compensate electric properties of an RF power module depending on changes with time, temperature dependency, variations, and the like of the grounded emitter current amplification factor of an HBT. Another object of the invention is to provide a technique for compensating and controlling base bias of an HBT, which reduces the influences of changes with time, temperature dependency, variations, and the like of the grounded emitter current amplification factor of an HBT having consistency with the APC bias control.

The above and other objects of the present invention and novel features will become apparent from the description of the specification and the appended drawings.

An outline of representative one of inventions disclosed in the application will be briefly described as follows.

An RF power module (RF_PA_MD) as one embodiment of the invention includes a compound semiconductor integrated circuit (GaAs IC) and a silicon semiconductor integrated circuit (Si IC).

The compound semiconductor integrated circuit (GaAs IC) includes an output hetero junction bipolar transistor (QTO) as a power amplifying transistor for outputting a transmission output signal of the RF power module (RF_PA_MD) and a reference hetero junction bipolar transistor (Qref) which are formed over a compound semiconductor chip by the same manufacturing process. The output hetero junction bipolar transistor (QTO) operates on a common emitter, the reference hetero junction bipolar transistor (Qref) operates on an emitter, a reference current (IQref) depending on the value of grounded emitter current amplification factor (hFE) of the emitter flows in the reference hetero junction bipolar transistor (Qref).

The silicon semiconductor integrated circuit (Si IC) includes a bias circuit (Bias Gen) for the output heterojunction bipolar transistor (QTO) over the silicon semiconductor substrate. The bias circuit (Bias Gen) includes a first current mirror (CM1) to which the reference current (IQref) of the reference hetero junction bipolar transistor (Qref) flows as input current and which generates output bias current (Ibias) that increases in response to decrease in the grounded emitter current amplification factor (hFE).

On the inside of the RF power module (RF_PA_MD), an external reference output terminal (T2) in which the reference current (IQref) of the reference hetero junction bipolar transistor (Qref) of the compound semiconductor integrated circuit (GaAs IC) flows and an input terminal (T2') of the first current mirror (CM1) of the bias circuit (Bias Gen) of the silicon semiconductor integrated circuit (Si IC) are electrically connected to each other, and an output terminal (T3') of the first current mirror (CM1) of the bias circuit (Bias Gen) of the silicon semiconductor integrated circuit (Si IC) and an external terminal (T3) of the compound semiconductor integrated circuit (GaAs IC) connected to the base of the output hetero junction bipolar transistor (QTO) are electrically connected to each other (refer to FIG. 1).

By the means of the embodiment of the present invention, in the compound semiconductor integrated circuit (GaAs IC), the output hetero junction bipolar transistor (QTO) and the reference hetero junction bipolar transistor (Qref) are formed by the same manufacturing process over the compound semiconductor chip, so that changes with time, variations, and the like of the grounded emitter current amplification factors hFE of both of the transistors are almost the same. In addition, since the temperatures of the transistors are almost the same in the single compound semiconductor chip, the temperature dependencies of the ground emitter current amplification factors hFE of the transistors are almost the same. Therefore, when the grounded emitter current amplification factor hFE of the output hetero junction bipolar transistor (QTO) drops below a target value due to changes with time, temperature dependency, variations, and the like, the grounded emitter current amplification factor hFE of the reference hetero junction bipolar transistor (Qref) also drops by almost the same amount. Due to the drop of the grounded emitter current amplification factor hFE of the reference hetero junction bipolar transistor (Qref), the reference current (IQref) of the reference hetero junction bipolar transistor (Qref) changes. However, the output bias current (Ibias) output from the output terminal (T3') of the first current mirror (CM1) of the bias circuit (Bias Gen) increases. By the output bias current (Ibias), the bias voltage of the base (T3) of the output hetero bipolar transistor (QTO) increases. Therefore, even when the grounded emitter current amplification factor (hFE) of the base (T3) of the output hetero junction bipolar transistor (QTO) drops, the bias voltage of the base rises, so that the collector current of the output hetero junction bipolar transistor (QTO) is maintained almost constant. As a result, the electric properties of the RF power module depending on the changes with time, temperature dependency, variations, and the like of the grounded emitter current amplification factor of the HBT can be compensated. Generation of the output bias current (Ibias) as outflow current from the reference current (IQref) as inflow current can be realized extremely easily by the first current mirror (CM1) of the bias circuit (Bias Gen) of the silicon semiconductor integrated circuit (Si IC) (refer to FIG. 1).

In the RF power module (RF_PA_MD) as a concrete mode of the invention, the bias circuit (Bias Gen) of the silicon semiconductor integrated circuit (Si IC) includes a second current mirror (CM2). When the bias current (Iapc) and the reference current (IQref) flowing in the collector of the reference hetero junction bipolar transistor (Qref) flow in an input of the second current mirror (CM2), a second current mirror output current generated from an output of the second current mirror (CM2) is increased by increase in the bias current (Iapc) the second current mirror output current is increased by decrease in the reference current (IQref). The second current mirror output current of the second current mirror (CM2) is supplied to the input terminal of the first current mirror (CM1), and the output bias current (Ibias) is output from the output terminal of the first current mirror (CM1) (refer to FIG. 2).

In the RF power module (RF_PA_MD) as a more concrete mode of the invention, the silicon semiconductor integrated circuit (Si IC) includes an APC circuit (APC_Cnt) comprising a comparator (Err_AmP) for comparing an output power detection signal (Vdet) related to transmission power (RFPout) of the RF power module (RF_PA_MD) and a transmission power level instruction signal (Vramp) with each other, and a voltage-current converter (V/I) for converting output voltage from the comparator (Err_Amp) to the bias current (Iapc). The bias current (Iapc) from the APC circuit (APC_Cnt) and the reference current (IQref) flowing in the collector of the reference hetero junction bipolar transistor (Qref) are input to the second current mirror (CM2) of the bias circuit (Bias Gen) (refer to FIG. 2).

According to the more concrete mode of the present invention, the technique for compensating and controlling the base bias of an HBT for reducing the influence of changes with time, temperature dependency, variations, and the like of the grounded emitter current amplification factor of an HBT having consistency with the APC bias control can be provided (refer to FIG. 2).

In the RF power module (RF_PA_MD) as a further concrete mode of the invention, the output hetero junction bipolar transistor (QTO) and the reference hetero junction bipolar transistor (Qref) of the compound semiconductor integrated circuit (GaAs IC) are of an NPN type. An input transistor (Qpin) and an output transistor (Qpout) of the first current mirror (CM1) of the bias circuit (Bias Gen) of the silicon semiconductor integrated circuit (Si IC) are P-channel field effect transistors (refer to FIGS. 1 and 2).

In the RF power module (RF_PA_MD) as a most concrete mode of the invention, the output hetero junction bipolar transistor (QTO) of the compound semiconductor integrated circuit (GaAs IC) includes a first output hetero junction bipolar transistor (QTO1) for outputting a first transmission signal (RFPout1) of a first frequency band (GSM) and a second output hetero junction bipolar transistor (QTO2) for outputting a second transmission signal (RFPout2) of a second frequency band (GSM). The first output hetero junction bipolar transistor (QTO1) and the second output hetero junction bipolar transistor (QTO2) are formed by the same manufacturing process as that of the reference hetero junction bipolar transistor (Qref). The output bias current (Ibias) from the output terminal (T3', T6') of the first current mirror (CM1) of the bias circuit (Bias Gen) of the silicon semiconductor integrated circuit (Si IC) is supplied to the base of each of the first and second output hetero junction bipolar transistors (QTO1 and QTO2) of the compound semiconductor integrated circuit (GaAs IC) (refer to FIG. 3).

In the RF power module (RF_PA_MD) as the most concrete mode of the invention, the bias circuit (Bias Gen) of the silicon semiconductor integrated circuit (Si IC) includes the reference current generating circuit (CS1) for generating the predetermined reference base current (ICS1) at an output terminal (T1'). The output terminal (T1') of the reference current generating circuit (CS1) of the bias circuit (Bias Gen) of the silicon semiconductor integrated circuit (Si IC) and an external reference input terminal (T1) of the compound semiconductor integrated circuit (GaAs IC) connected to the reference hetero junction bipolar transistor (Qref) are electrically connected to each other (FIGS. 1, 2, 3, and 4).

With the means of the most concrete mode of the present invention, the base of the reference hetero junction bipolar transistor (Qref) is connected to the external reference input terminal (T1) of the compound semiconductor integrated circuit (GaAs IC) to which the predetermined reference base current (ICS1) from the output terminal (T1') of the reference current generating circuit (CS1) of the bias circuit (Bias Gen) of the silicon semiconductor integrated circuit (Si IC) is supplied, and the reference current (IQref) flowing in the collector of the reference hetero junction bipolar transistor (Qref) and the external reference output terminal (T2) is supplied to the input terminal of the first current mirror (CM1) of the bias circuit (Bias Gen) of the silicon semiconductor integrated circuit (Si IC) (refer to FIGS. 2, 3, and 4).

Effects obtained by representative one of the inventions disclosed in the application will be briefly described as follows.

According to the present invention, electric properties of the RF power module depending on changes with time, temperature dependency, variations, and the like of the grounded emitter current amplification factor of an HBT can be compensated.

DETAILED DESCRIPTION OF PREFERRED EMBODIMENTS

Basic Configuration of RF Power Module

Figure 1:
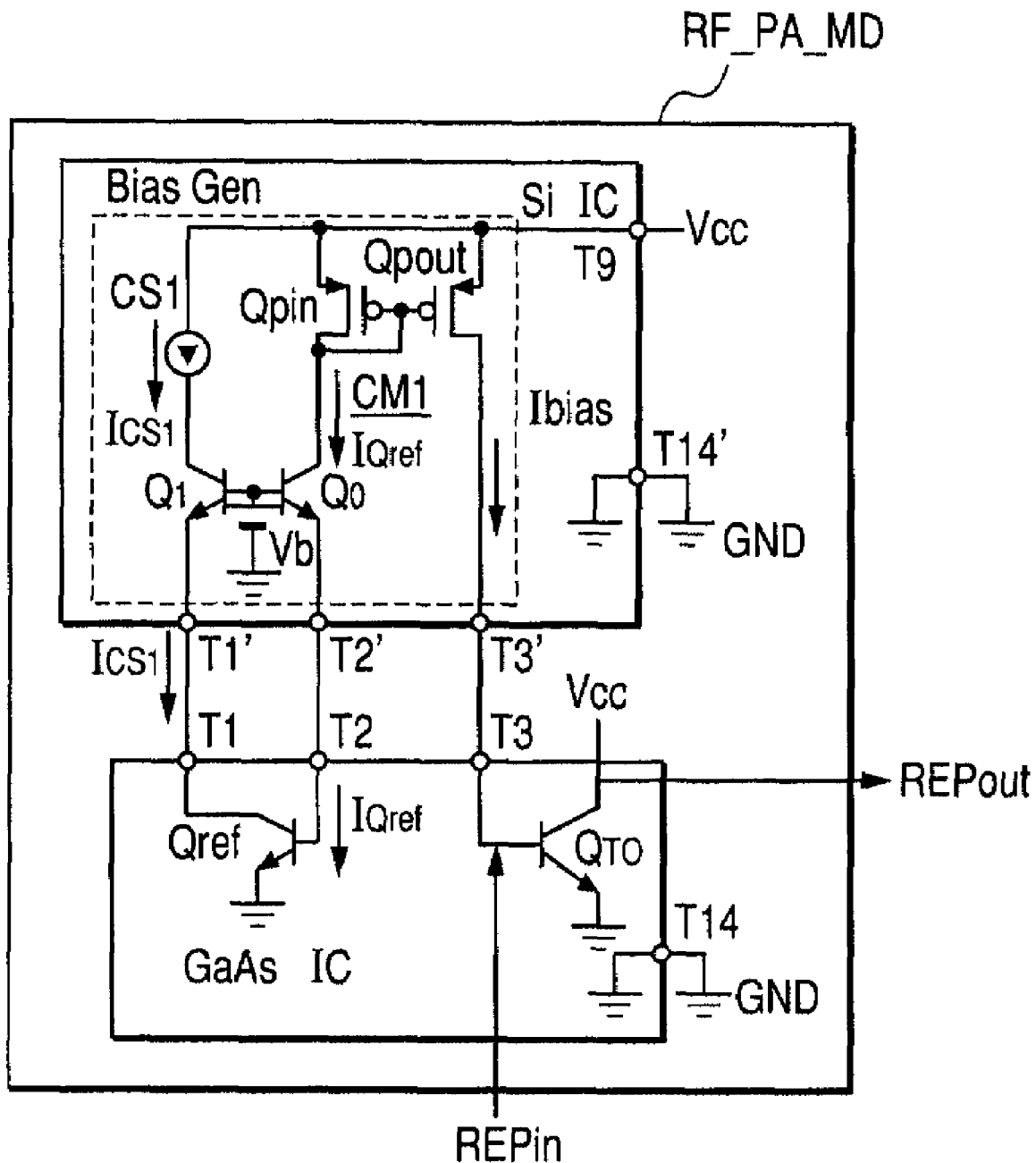
FIG. 1 is a diagram showing the configuration of an RF power module according to a basic embodiment of the present invention.

FIG. 1 is a diagram showing the configuration of an RF power module according to a basic embodiment of the invention.

As shown in the diagram, an RF power module RF_PA_MD includes a compound semiconductor integrated circuit GaAS IC and a silicon semiconductor integrated circuit Si IC. The compound semiconductor integrated circuit GaAs IC includes an output hetero junction bipolar transistor QTO as a power amplifying transistor for receiving a transmission input signal RFPin of the RF power module RF_PA_MD and outputting a transmission output signal RFPout and a reference hetero junction bipolar transistor Qref which are formed over a compound semiconductor chip by the same manufacturing process. The output hetero junction bipolar transistor QTO operates on a common emitter, and the reference hetero junction bipolar transistor Qref also operates on a common emitter. The silicon semiconductor integrated circuit Si IC includes a bias circuit Bias Gen. The bias circuit Bias Gen includes a first current mirror CM1 to which reference current IQref of the reference HBT Qref depending on the value of a grounded emitter current amplification factor of the reference HBT Qref flows as input current and which generates output bias current Ibias that increases in response to decrease in the grounded emitter current amplification factor. In the RF power module RF_PA_MD, an external reference output terminal T2 of the compound semiconductor integrated circuit GaAs IC connected to the base of the reference HBT Qref and an input terminal T2' of the first current mirror CM1 of the bias circuit Bias Gen of the silicon semiconductor integrated circuit Si IC are electrically connected to each other, and an output terminal T3' of the first current mirror CM1 of the bias circuit Bias Gen of the silicon semiconductor integrated circuit Si IC and a base T3 of the output HBT QTO in the compound semiconductor integrated circuit GaAs IC are electrically connected to each other.

The base of the reference HBT Qref is connected to the input terminal of the first current mirror CM1 of the bias current Bias Gen of the silicon semiconductor integrated circuit Si IC via the external reference output terminal T2 and the external terminal T2'. The collector of the reference HBT Qref is electrically connected to the output terminal of a reference current generating circuit CS1 in the bias circuit Bias Gen of the silicon semiconductor circuit Si IC via an external reference input terminal T1 and an external terminal T1' on the inside of the module. The reference current generating circuit CS1 can be constructed by a constant current source for generating a reference base current ICS1 having a predetermined current value. As a result, when grounded emitter current amplification factor of the reference HBT Qref of the compound semiconductor integrated circuit GaAs IC is hFE, the base reference current IQref of the reference HBT Qref is expressed as IQref<ICS1/hFE. The base reference current IQref of the reference HBT Qref as inflow current becomes an input current of an input terminal of the first current mirror CM1 in the bias circuit Bias Gen of the silicon semiconductor integrated circuit Si IC via the external reference output terminal T2 and the external terminal T2'. Therefore, the output bias current Ibias proportional to the base reference current IQref of the reference HBT Qref as the input current is output as outflow current from the output terminal T3' of the first current mirror CM1. The output bias current Ibias from the output terminal T3' of the first current mirror CM1 is supplied as input current of the output HBT QTO via an output terminal T3 of the compound semiconductor integrated circuit GaAs IC to the base.

On the other hand, in the compound semiconductor integrated circuit GaAs IC, the output hetero junction bipolar transistor QTO and the reference hetero junction bipolar transistor Qref are formed by the same manufacturing process over the compound semiconductor chip, so that changes with time, variations, and the like of the grounded emitter current amplification factors hFE of both of the transistors become almost the same. Therefore, when the grounded emitter current amplification factor hFE of the output HBT QTO drops below a target value due to changes with time, temperature dependency, variations, and the like, the grounded emitter current amplification factor hFE of the reference HBT Qref also drops by almost the same amount. Due to the drop of the grounded emitter current amplification factor hFE of the reference HBT Qref, the base reference current IQref (IQref=ICS1/hFE) of the reference HBT Qref increases. Therefore, the output bias current Ibias output from the output terminal T3 of the first current mirror CM1 of the bias circuit Bias Gen similarly increases, and the bias voltage of the base T3 of the output HBT QTO increases. Therefore, even when the grounded emitter current amplification factor hFE of the output HBT QTO drops, the base bias rises, so that the collector current of the output HBT QTO is maintained almost constant. As a result, the electric properties of the RF power module depending on the changes with time, temperature dependency, variations, and the like of the grounded emitter current amplification factor of the output HBT can be compensated.

Bipolar transistors Q0 and Q1 each having a base to which bias voltage Vb is applied in the bias circuit Bias Gen of the silicon semiconductor integrated circuit Si IC are inserted to decrease voltage applied to the reference HBT Qref in the compound semiconductor integrated circuit GaAs IC. Via the collector-emitter path of the bipolar transistor Q1, the reference base current ICS1 from the reference current generating circuit CS1 is supplied to the collector of the reference HBT Qref. Via the collector-emitter path of the bipolar transistor Q0, the reference current IQref of the reference HBT Qref is supplied to the input of the first current mirror CM1.

Concrete Configuration of RF Power Module

Figure 2:
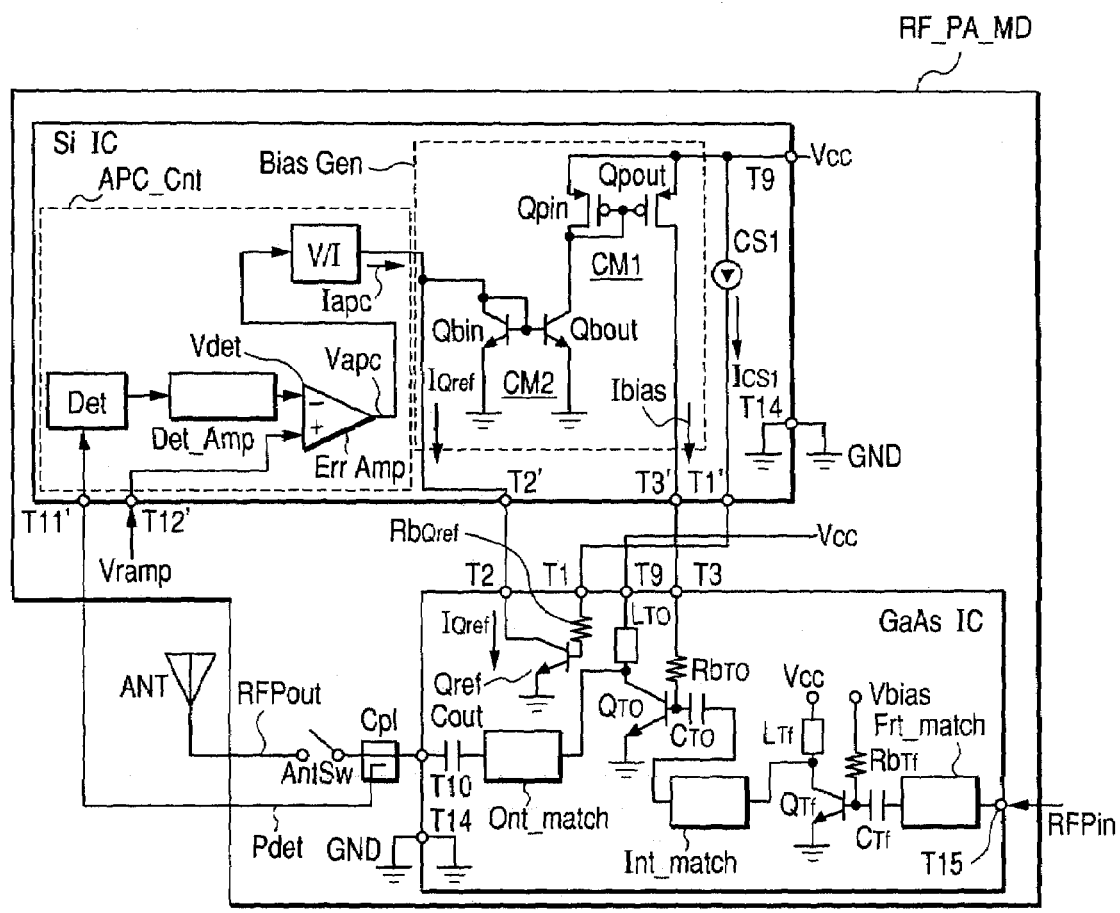
FIG. 2 is a diagram showing a concrete configuration of an RF power module according to an embodiment of the invention.

FIG. 2 is a diagram showing a concrete configuration of an RF power module as an embodiment of the invention.

As shown in the diagram, the RF power module RF_PA_MD includes a compound semiconductor integrated circuit GaAS IC and a silicon semiconductor integrated circuit Si IC. The compound semiconductor integrated circuit GaAs IC includes an output hetero junction bipolar transistor QTO as a power amplifying transistor for receiving a transmission input signal RFPin of the RF power module RF_PA_MD and outputting a transmission output signal RFPout, and a reference hetero junction bipolar transistor Qref which are formed over a compound semiconductor chip by the same manufacturing process. The output HBT QTO operates on a common emitter, and the reference HBT Qref also operates on a common emitter. The silicon semiconductor integrated circuit Si IC includes a bias circuit Bias Gen. The bias circuit Bias Gen includes a first current mirror CM1 to which reference current IQref of the reference HBT Qref depending on the value of a grounded emitter current amplification factor of the reference HBT Qref flows as input current and which generates output bias current Ibias that increases in response to decrease in the grounded emitter current amplification factor. In the RF power module RF_PA_MD, an external reference output terminal T2 of the compound semiconductor integrated circuit GaAs IC connected to the collector of the reference HBT Qref and an input terminal T2' of a second current mirror CM2 of the bias circuit Bias Gen of the silicon semiconductor integrated circuit Si IC are electrically connected to each other, and an output terminal T3' of the first current mirror CM1 of the bias circuit Bias Gen of the silicon semiconductor integrated circuit Si IC and an external terminal T3 of the compound semiconductor integrated circuit GaAs IC connected to the base of the output HBT QTO are electrically connected to each other. To an external terminal T15 of the compound semiconductor integrated circuit Ga As IC, the RF input signal RFPin to be power-amplified is supplied an RF analog signal processing unit such as an RF IC. The RF input signal RFPin is supplied to the input of an input matching circuit Frt_match. The RF input signal from the output of the input matching circuit Frt_match is supplied to the base of an HBT QTf of a pre-amplifier via a coupling capacitor CTf. Bias voltage Vbias is supplied to the base of the first-stage HBT QTf via a resistor RbTf. The collector of the HBT Qtf is connected to a power source voltage Vcc of an external terminal T9 via an inductor LTf as a load, and is also connected to the input of an interstage matching circuit Int_match. The RF signal from the interstage matching circuit Int_match is supplied to the base of a first stage QTo of an output stage amplifier via a coupling capacitor CTo. The base of the output stage HBT QTo is connected to the external terminal T3 via a resistor RbTo, and the collector of the output stage HBT QTo is connected to the power source voltage Vcc via an inductor LTO as a load and is also connected to the input of an output matching circuit Out_match. An RF amplified output signal from the collector of the output stage HBT QTo is obtained from an external terminal T10 via the output matching circuit Out_match and an output capacitor Cout. An external terminal T14 of the compound semiconductor integrated circuit GaAs IC is a grounding terminal and is connected to the grounding conductor of the RF power module RF_PA_MD. The base and the collector of the reference HBT Qref formed over a GaAS semi-insulating substrate formed by the same manufacturing process as that of the first-stage HBT QTf and the output stage HBT QTo are connected to an external reference input terminal T1 and the external reference output terminal T2, respectively. The emitter of the reference HBT Qref is grounded via an external terminal T14. An RF amplified output signal obtained from the external terminal T10 via the output capacitor Cout is supplied as transmission power RFPout to a transmission antenna ANT of a cellular phone via an antenna switch AntSw. A power detection coupler Cp1 is connected to the external terminal T10, and a power detection signal Pdet is generated from the power detection coupler Cp1. The power detection signal Pdet is supplied to an external terminal T11' of the silicon semiconductor integrated circuit Si Ic. On the surface of the GaAs semi-insulating substrate of the compound semiconductor integrated circuit GaAs IC, the load inductors LTf and LTO are formed by spiral inductors, and capacitors and coils of the matching circuits Frt_match, Int_match, and Out_match, the base resistors RbTf and RbTO, and the coupling capacitors CTf, CTO, and Cout are also formed.

The silicon semiconductor integrated circuit Si IC includes an APC circuit APC_Cnt constructed by a comparator Err_AmP for comparing an output power detection signal Vdet related to the transmission power RFPout of the RF power module RF_PA_MD and a transmission power level instruction signal Vramp with each other, and a voltage-current converter V/I for converting output voltage from the comparator Err_Amp to bias current Iapc. The bias current Iapc from the APC circuit APC_Cnt and the reference current IQref flowing in the collector of the reference hetero junction bipolar transistor Qref are input to the second current mirror CM2 of the bias circuit Bias Gen. Specifically, in the silicon semiconductor integrated circuit Si IC, the level of the power detection signal Pdet supplied to the external terminal T11' is detected by the power level detector Det. An output of the power level detector Det is amplified by a detection amplifier Det_Amp, and an output of the detection amplifier Det_Amp is supplied to an inversion input terminal (−) of the comparator Err_Amp. To a non-inversion input terminal (+) of the comparator Err_Amp, the lamp voltage Vramp as a transmission power level instruction signal to be supplied from a baseband signal processing unit such as a baseband LSI to the external terminal T12' via an RF analog signal processing unit such as an RF IC is supplied, and the APC voltage Vapc is generated from the output of the comparator Err_Amp. The APC voltage Vapc of the output of the comparator Err_Amp is converted to the APC current Iapc as bias current by the voltage-current converter V/I. The APC current Iapc is supplied to the input of the second current mirror CM2 of the bias circuit Bias Gen of the silicon semiconductor integrated circuit Si IC, and the input is connected to the collector of the reference HBT Qref in the compound semiconductor integrated circuit GaAs IC via the external reference output terminal T2' and the external terminal T2. The base of the reference HBT Qref is connected to the output terminal of the reference current generating circuit CS1 of the bias current Bias Gen of the silicon semiconductor integrated circuit Si IC via the external reference input terminal T1 and the external terminal T1' on the inside of the module. The reference current generating circuit CS1 can be constructed by a constant current source for generating a reference base current ICS1 having a predetermined current value. As a result, when grounded emitter current amplification factor of the reference HBT Qref of the compound semiconductor integrated circuit GaAs IC is hFE, the collector reference current IQref of the reference HBT Qref is expressed as IQref=hFE·ICS1. The collector reference current IQref of the reference HBT Qref becomes an input current of the second current mirror CM2 in the bias circuit Bias Gen of the silicon semiconductor integrated circuit Si IC via the external terminals T2 and T2'. Since current of a value obtained by subtracting the collector reference current IQref from the APC current Iapc flows in an input transistor Qbin of the second current mirror CM2 of the bias circuit Bias Gen of the silicon semiconductor integrated circuit Si IC, current proportional to the computed value flow in an output transistor Qbout of the second current mirror CM2. Since the proportional current of the output transistor Qbout of the second current mirror CM2 flows in a P-channel MOSFET that forms an input transistor Qpin of the first current mirror CM1, the output bias current Ibias flowing in the P-channel MOSFET that forms the output transistor Qpout of the first current mirror CM1 is also proportional to the computed value. The input transistor Qbin and the output transistor Qbout of the second current mirror CM2 do not have to be constructed by P-channel MOSFETs but may be constructed by lateral PNP-type bipolar transistors. However, the grounded emitter current amplification factor hFE of the lateral PNP-type bipolar transistor is much lower than that of a vertical bipolar transistor. Therefore, the ratio (current mirror ratio) between input current and output current of the second current mirror CM2 has an offset error due to large base current of the lateral PNP-type bipolar transistor. From this viewpoint, it is advantageous to form the input transistor Qbin and the output transistor Qpout of the second current mirror CM2 by P-channel MOSFETs.

On the other hand, in the compound semiconductor integrated circuit GaAs IC, the output hetero junction bipolar transistor QTO and the reference hetero junction bipolar transistor Qref are formed by the same manufacturing process over the compound semiconductor chip, so that changes with time, variations, and the like of the grounded emitter current amplification factors hFE of both of the transistors are almost the same. Since the temperatures of both of the transistors are almost equal to each other in one compound semiconductor chip, the temperature dependencies of the grounded emitter current amplifier factors hFE of the transistors almost equal to each other. Therefore, when the grounded emitter current amplification factor hFE of the output HBT QTO drops below a target value due to changes with time, temperature dependency, variations, and the like, the grounded emitter current amplification factor hFE of the reference HBT Qref also drops by almost the same amount. Due to the drop of the grounded emitter current amplification factor hFE of the reference HBT Qref, the collector current IQref of the reference HBT Qref decreases. However, the output bias current Ibias output from the output transistor Qpout of the first current mirror CM1 of the bias circuit Bias_Gen increases. Therefore, the bias voltage of the base T3 of the output HBT QTO increases by the output bias current Ibias. Even when the grounded emitter current amplification factor hFE of the output HBT QTO drops, the bias voltage of the base rises, so that the collector current of the output HBT QTO is maintained almost constant. As a result, the electric properties of the RF power module depending on the changes with time, temperature dependency, variations, and the like of the grounded emitter current amplification factor of the output HBT can be compensated.

Figure 5:
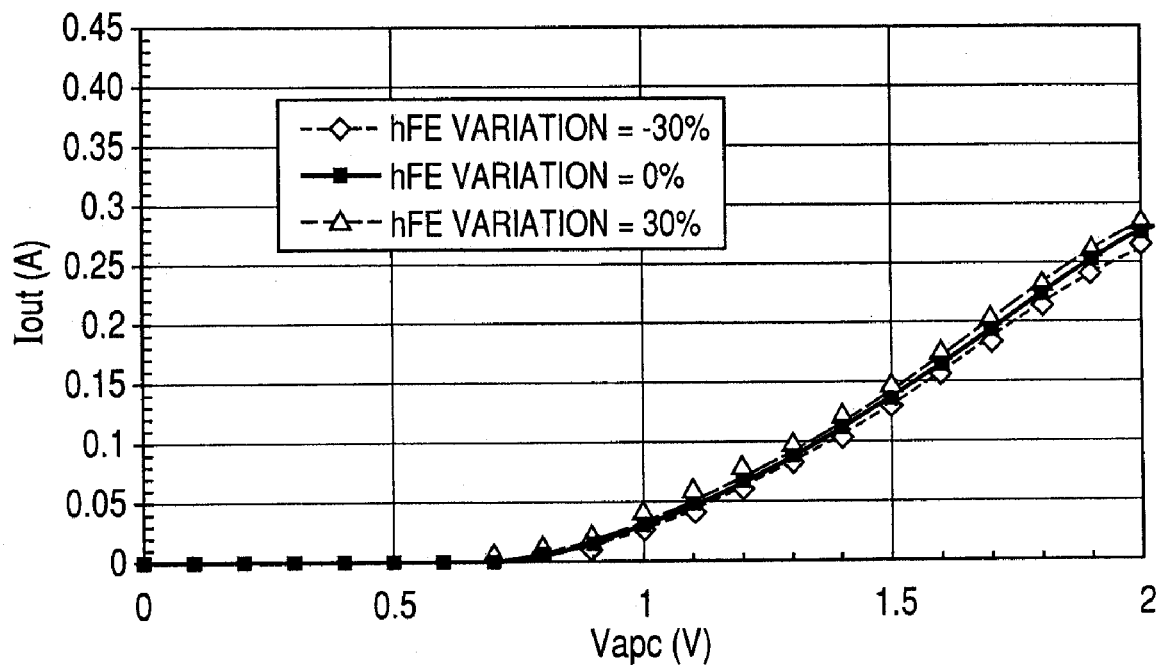
FIG. 5 shows variations in output current Iout in a collector of an output HBT QTO in response to changes in APC voltage Vapc when grounded emitter current amplification factor of an output hetero junction bipolar transistor in the RF power module shown in FIG. 2 changes by −30%, 0%, and +30% from a target value.
Figure 6:
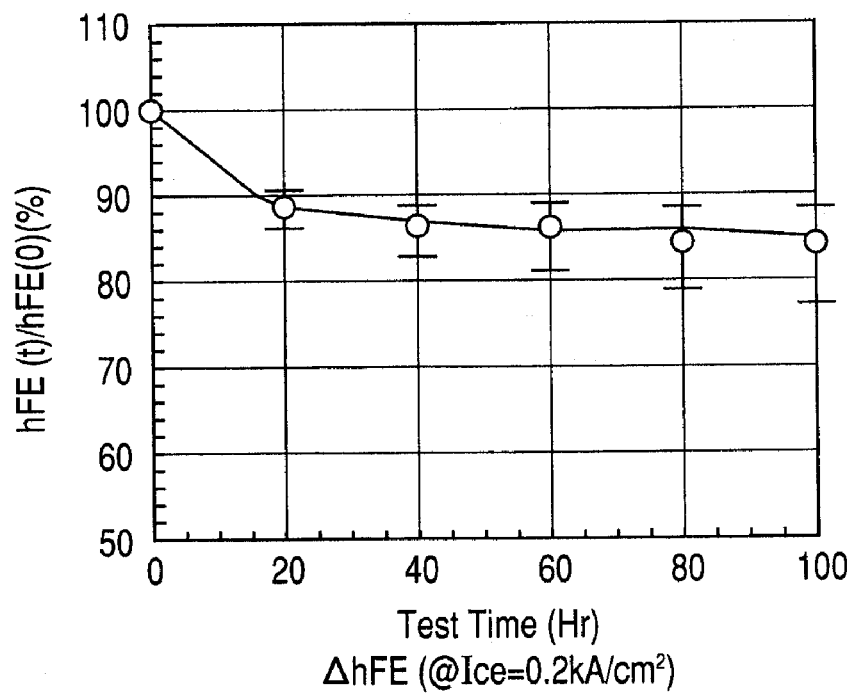
FIG. 6 is a diagram showing changes with time of the grounded emitter current amplification factor as one of important device parameters of electric properties of the hetero junction bipolar transistor.

FIG. 5 shows variations in output current Iout in the collector of the output HBT QTO in response to changes in the APC voltage Vapc when grounded emitter current amplification factor hFE of the output hetero junction bipolar transistor QTO in the RF power module RF_PA_MD shown in FIG. 2 changes by −30%, 0%, and +30% from a target value. It is understood from FIG. 5 that even when the grounded emitter current amplification factor hFE of the output HBT QTO largely changes, a change in the collector output current Iout of the output HBT QTO is extremely small. In such a manner, the electric properties of the RF power module depending on changes with time, temperature dependency, variations, and the like of the grounded emitter current amplification factor of the HBT can be compensated.

In FIG. 2, the resistor RbTo connected to the base of the output HBT QTO is a base ballast resistor for preventing current concentration. A resistor RbTQref at the base of the reference HBT Qref is connected in correspondence with the base ballast resistor RbTo of the output HBT QTO.

RF Power Module According to Other Embodiments

Figure 3:
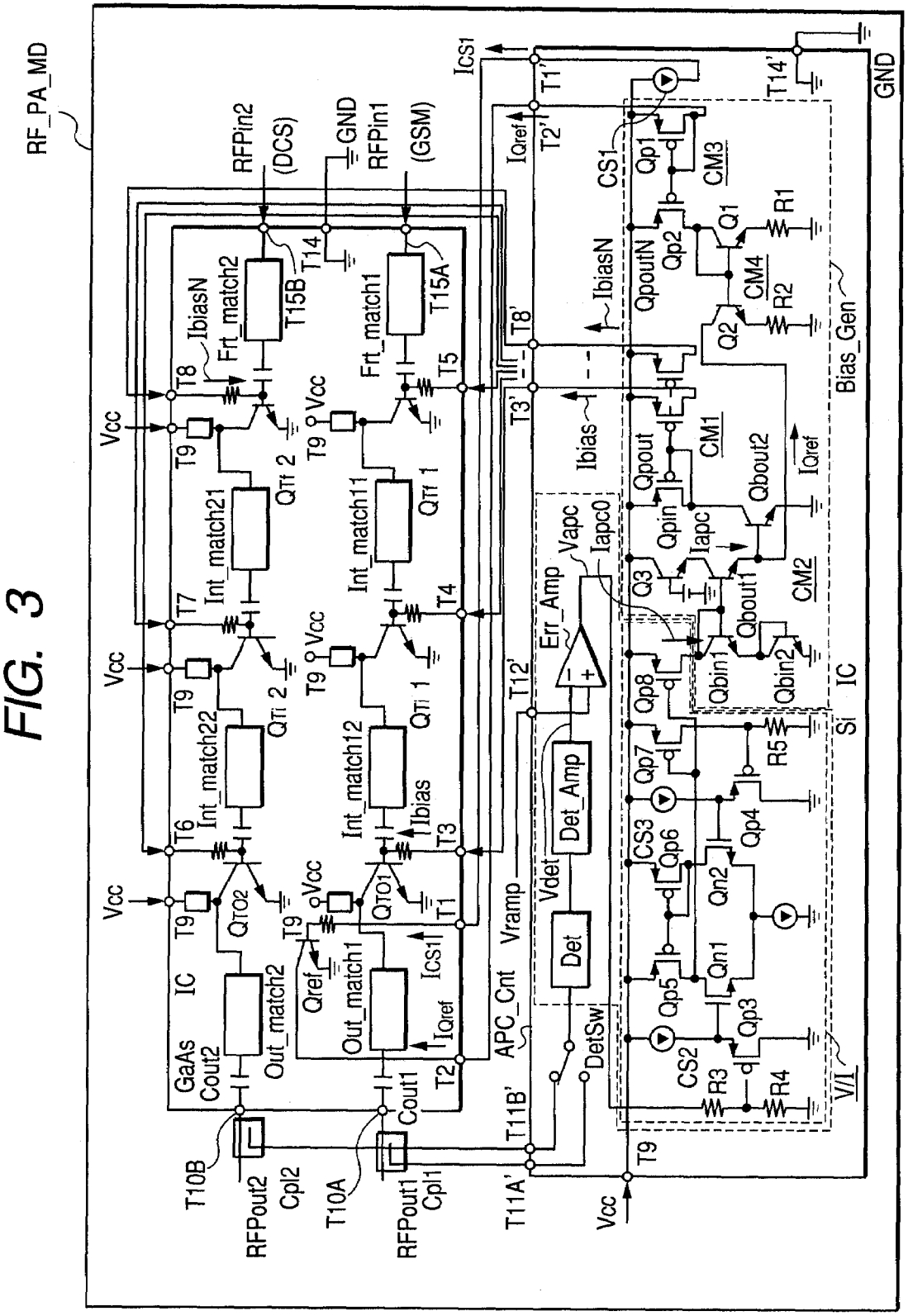
FIG. 3 is a diagram showing the configuration of an RF power module according to another embodiment of the invention.

FIG. 3 is a diagram showing the configuration of an RF power module according to another embodiment of the invention.

As shown in the diagram, the RF power module is constructed so that transmission signals RFPin1 and RFpin2 in two frequency bands can be transmitted; the transmission signal RFPin1 in the frequency band of 900 MHz of the GSM (Global Systems for Mobile communications) and the transmission signal RFPin2 in the frequency band of 1800 MHz of the DCS (Digital Communication System). In a time zone, the transmission signal RFPin1 in the frequency band of 900 MHz of the GSM is supplied to an external terminal T15A of the compound semiconductor integrated circuit GaAs IC. In another time zone, the transmission signal RFPin2 in the frequency band of 1800 MHz of the DCS is supplied to an external terminal T15B of the compound semiconductor integrated circuit GaAs IC. The transmission signal RFPin1 in the frequency band of 900 MHz of the GSM supplied to the external terminal T15A is sequentially amplified by the HBT QTf at the first stage, an HBT QTi1 at an intermediate stage, and an HBT QTO1 at the final output stage, and a transmission output signal RFPout1 in the frequency band of 900 MHz of the GSM is generated from an output terminal T10A via an output matching circuit Out_match1. The transmission signal RFPin2 of 1800 MHz of the DCS supplied to the external terminal T15A is sequentially amplified by an HBT QTf2 at the first stage, an HBTQTi2 at an intermediate stage, and an HBT QTO2 at the final output stage, and a transmission output signal RFPout2 in the frequency band of 1800 MHz of the DCS is generated from an output terminal T10B via an output matching circuit Out_match2 and an output capacitor Cout2. The reference hetero junction bipolar transistor Qref is disposed between the HBT QTO1 at the final output stage for the frequency band of 900 MHz of the GSM ad the HBT QTO2 at the final output stage for the frequency band of 1800 MHz of the DCS. The emitter of the reference HBT Qref is grounded, and the base is electrically connected to the output terminal of the reference current generating circuit CS1 of the bias circuit Bias_Gen of the silicon semiconductor integrated circuit Si IC via the external reference input terminal T1 and the external terminal T1' on the inside of the module. The collector of the HBT Qref is electrically connected to the external terminal T2' of the silicon semiconductor integrated circuit Si IC via the external reference output terminal T2 on the inside of the module. By connecting a third current mirror CM3 and a fourth current mirror CM4 that form a part of an input of the bias circuit Bias_Gen to the external terminal T2' of the silicon semiconductor integrated circuit Si IC, current proportional to the collector reference current IQref of the HBT Qref flows in the collector of the output transistor Q2 in the fourth current mirror CM4. In the second current mirror CM2 that forms another part of the input of the bias circuit Bias_Gen, current proportional to the collector reference current IQref is subtracted from the APC current Iapc proportional to the APC current Iapc0 from the voltage-current converter V/I. As a result, in a manner similar to FIG. 2, also in FIG. 3, even when the grounded emitter current amplification factor hFE of the output hetero junction bipolar transistors QTO1 and QTO2 drops, the base bias rises, so that the collector current of the output hetero junction bipolar transistors QTO1 and QTO2 can be maintained almost constant. In FIG. 2, by connecting power detection couplers Cp1 and CP2 to the external terminals T10A and 10B, respectively, power detection signals are generated from the two power detection couplers Cp1 and CP2. A power detection signal from the power detection coupler Cp1 shows the level of the transmission output signal RFPout1 in the frequency band of 900 MHz of the GSM from the output terminal T10A. On the other hand, a power detection signal from the power detection coupler Cp2 shows the level of the transmission output signal RFPout2 in the frequency band of 1800 MHz of the DCS from the output terminal T10B. The two power detection signals are supplied to two external terminals T11A and 11B of the silicon semiconductor integrated circuit Si IC. One of the two power detection signals is selected by a detection switch DetSw, and the selected power detection signal is applied to the input of a power level detector Det. An output of the power level detector Det is amplified by a detection amplifier Det_Amp. An output of the detection amplifier Det_Amp is supplied to the inversion input terminal (−) of the comparator Err_Amp. To a non-inversion input terminal (+) of the comparator Err_Amp, the lamp voltage Vramp as a transmission power level instruction signal to be supplied from a baseband signal processing unit such as a baseband LSI via an RF analog signal processing unit such as an RF IC is supplied, and the APC voltage Vapc is generated from the output of the comparator Err_Amp. The APC voltage Vapc of the output of the comparator Err_Amp is converted to an APC current Iapc0 by the voltage-current converter V/I. The voltage-current converter V/I includes voltage dividing resistors R3 and R4, P-channel MOSFETs Qp3 and Qp4, differential N-channel MOSFETs Qn1 and Qn2, active-load P-channel MOSFETs Qp5 and Qp6, P-channel MOSFETs Qp7 and Qp8 for outputting current, a current-voltage converting resistor R5, and constant current sources CS2, CS3, and CS4. An APC voltage divided by the voltage-dividing resistors R3 and R4 is applied to the current-voltage converting resistor R5 via the P-channel MOSFET Qp7 for outputting current. According to the ratio between the divided APC voltage and the current-voltage converting resistor R5, current flowing in the P-channel MOSFET Qp7 for outputting current is determined. The source and the gate of the P-channel MOSFET Qp7 are connected in parallel with the source and the gate of the P-channel MOSFET Qp8. Therefore, when the devices sizes of the P-channel MOSFETs Qp7 and Qp8 are the same, APC current Iapc0 having the same current value as that of the P-channel MOSFET Qp7 is supplied from the P-channel MOSFET Qp8 for outputting current to the input of the second current mirror CM2 of the bias circuit Bias_Gen. Thus, in the second current mirror CM2 of the bias circuit Bias_Gen, current proportional to collector reference current IQref is subtracted from the APC current Iapc proportional to the APC current Iapc0 from the voltage-current converter V/I.

Figure 4:
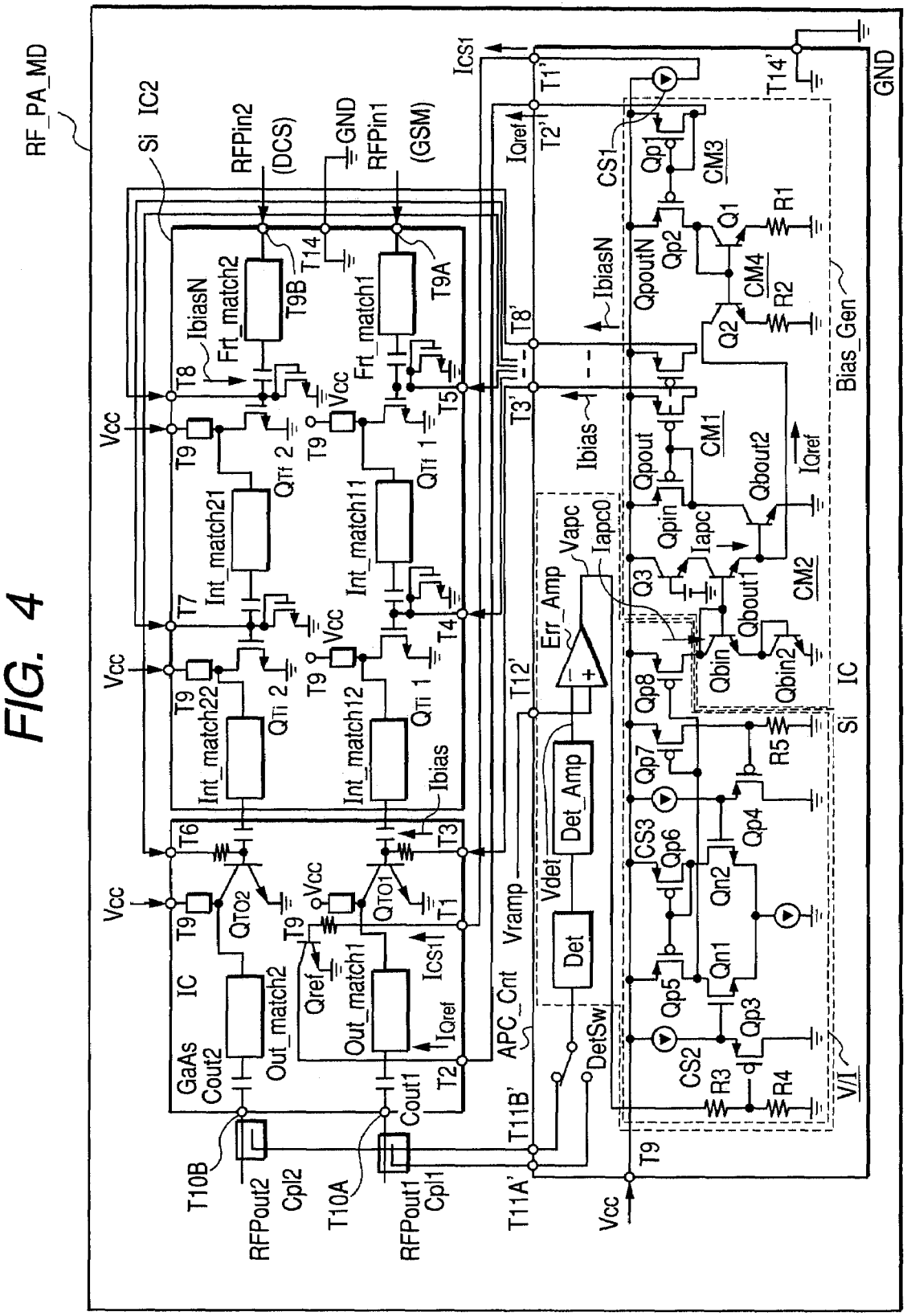
FIG. 4 is a diagram showing the configuration of an RF power module according to further another embodiment of the invention.

FIG. 4 is a diagram showing the configuration of an RF power module according to further another embodiment of the invention.

The RF power module in FIG. 4 is obtained by replacing the transistor QTf1 at the first stage and the transistor QTi1 at an intermediate stage for the transmission signal RFPin1 in the frequency band of 900 MHz of the GSM and the transistor QTf2 at the first stage and the transistor STi2 at an intermediate stage for the transmission signal RFPin2 of 1800 MHz of the DCS of the embodiment of FIG. 3 which are constructed by the hetero junction bipolar transistors are replaced with radio frequency silicon power MOSFETs formed on the silicon semiconductor substrate. In association with replacement of the transistors QTf1, QTi1, QTf2, and QTi2 with the radio frequency silicon power MOSFETs, the transistors QTf1, QTi1, QTf2, and QTi2 are mounted on the chip of the second silicon semiconductor integrated circuit Si IC2. It is however the most preferred mode to use the chip of the silicon semiconductor integrated circuit Si IC at the bottom of FIG. 3 also as the chip of the second silicon semiconductor integrated circuit Si IC2, thereby realizing one chip. Although the input matching circuits Frt_match1 and Frt_match2 and the interstage matching circuits Int_match11, Int_match12, Int_match21, and Int_match22 are formed on the chip of the compound semiconductor integrated circuit GaAs IC in the embodiment of FIG. 3, they are formed on the chip of the silicon semiconductor integrated circuit Si IC2 in the embodiment of FIG. 4.

In FIG. 4, the diode-connected MOS transistors connected to the external terminals T4, T5, T7, and T8 on the chip of the second silicon semiconductor integrated circuit Si IC2 convert output bias current from the first current mirror CM1 of the bias circuit Bias Gen supplied from the external terminals T4', T5', T7', and T8' of the second silicon semiconductor integrated circuit Si IC2 corresponding to the external terminals T4, T5, T7, and T8 to bias voltages. The bias voltages serve as gate bias of the radio frequency silicon power MOSFETs QTf1, QTi1, QTf2, and QTi2.

Although the present invention achieved by the inventors herein has been concretely described on the basis of the embodiments, obviously, the invention is not limited to the embodiments but can be variously modified without departing from the gist.

For example, as power detectors replacing the power detection couplers Cp1, Cp11, and Cp12 in FIGS. 2, 3, and 4, HBTs for power detection having small size which are connected in parallel with the output HBTs may be used. The present invention can be applied to the current sense method of detecting the transmission power level from the current flowing in the HBTs for power detection.

Alternatively, diode-connected HBTs for bias similar to the diode-connected MOS transistors connected to the external terminals T4, T5, T7, and T8 on the chip of the second silicon semiconductor integrated circuit (Si IC2) shown in FIG. 4 are connected to the external terminals T4, T5, T7, and T8 of the compound semiconductor integrated circuit (GaAs IC) in FIG. 3. The bias voltages of the diode-connected HBTs for bias are used as base bias of the high frequency HBTs QTf1, QTi1, QTf2, and QTi2.

For the hetero junction bipolar transistors, not only the compound semiconductor of GaAs/AlGaAs but also a compound semiconductor obtained by alloying an element of the third group such as In (indium) and an element of the fifth group such as P (phosphorus) can be used. Further, to prevent current concentration of the hetero junction bipolar transistor, other than the base ballast resistor, an emitter ballast resistor can be used.

What is claimed is:

1. An RF power module comprising a compound semiconductor integrated circuit and a silicon semiconductor integrated circuit, wherein the compound semiconductor integrated circuit includes an output hetero junction bipolar transistor as a power amplifying transistor for outputting an RF transmission output signal and a reference hetero junction bipolar transistor which are formed over a compound semiconductor chip by the same manufacturing process, the output hetero junction bipolar transistor operates on a common emitter, the reference hetero junction bipolar transistor operates on an emitter, a reference current depending on the value of grounded emitter current amplification factor of the emitter flows in the reference hetero junction bipolar transistor, wherein the silicon semiconductor integrated circuit includes a bias circuit for the hetero junction bipolar transistor over a silicon semiconductor substrate, the bias circuit includes a first current mirror to which the reference current of the reference hetero junction bipolar transistor flows as input current and which generates output bias current that increases in response to decrease in the grounded emitter current amplification factor, and wherein an external reference output terminal in which the reference current of the reference hetero junction bipolar transistor of the compound semiconductor integrated circuit flows and an input terminal of the first current mirror of the bias circuit of the silicon semiconductor integrated circuit are electrically connected to each other, and an output terminal of the first current mirror of the bias circuit of the silicon semiconductor integrated circuit and an external terminal of the compound semiconductor integrated circuit connected to the base of the output hetero junction bipolar transistor are electrically connected to each other.

2. The RF power module according to claim 1, wherein the bias circuit of the silicon semiconductor integrated circuit includes a second current mirror, a bias current and the reference current flowing in the collector of the reference hetero junction bipolar transistor flow in an input of the second current mirror, a second current mirror output current generated from an output of the second current mirror is increased by increase in the bias current, the second current mirror output current is increased by decrease in the reference current, the second current mirror output current of the second current mirror is supplied to the input terminal of the first current mirror, and the output bias current is output from the output terminal of the first current mirror.

3. The RF power module according to claim 2,
wherein the silicon semiconductor integrated circuit includes an APO circuit comprising a comparator for comparing an output power detection signal related to transmission power of the RF power module and a transmission power level instruction signal with each other, and a voltage-current converter for converting output voltage from the comparator to the bias current, and
wherein the bias current from the APO circuit and the reference current flowing in the collector of the reference hetero junction bipolar transistor are input to the second current mirror of the bias circuit.

4. The RF power module according to claim 1,
wherein the output hetero junction bipolar transistor and the reference hetero junction bipolar transistor of the compound semiconductor integrated circuit are of an NPN type, and
wherein an input transistor and an output transistor of the first current mirror of the bias circuit of the silicon semiconductor integrated circuit are P-channel field effect transistors.

5. The RF power module according to claim 2,
wherein the output hetero junction bipolar transistor and the reference hetero junction bipolar transistor of the compound semiconductor integrated circuit are of an NPN type, and
wherein an input transistor and an output transistor of the first current mirror of the bias circuit of the silicon semiconductor integrated circuit are P-channel field effect transistors.

6. The RF power module according to claim 3,
wherein the output hetero junction bipolar transistor and the reference hetero junction bipolar transistor of the compound semiconductor integrated circuit are of an NPN type, and
wherein an input transistor and an output transistor of the first current mirror of the bias circuit of the silicon semiconductor integrated circuit are P-channel field effect transistors.

7. The RF power module according to claim 1,
wherein the output hetero junction bipolar transistor of the compound semiconductor integrated circuit includes a first output hetero junction bipolar transistor for outputting a first transmission signal of a first frequency band and a second output hetero junction bipolar transistor for outputting a second transmission signal of a second frequency band,
wherein the first output hetero junction bipolar transistor and the second output hetero junction bipolar transistor are formed by the same manufacturing process as that of the reference hetero junction bipolar transistor, and
wherein the output bias current from the output terminal of the first current mirror of the bias circuit of the silicon semiconductor integrated circuit is supplied to the base of each of the first and second output hetero junction bipolar transistors of the compound semiconductor integrated circuit.

8. The RF power module according to claim 1,
wherein the bias circuit of the silicon semiconductor integrated circuit includes the reference current generating circuit for generating the predetermined reference base current at an output terminal, and
wherein the output terminal of the reference current generating circuit of the bias circuit of the silicon semiconductor integrated circuit and an external reference input terminal of the compound semiconductor integrated circuit connected to the reference hetero junction bipolar transistor are electrically connected to each other.

9. The RF power module according to claim 8, wherein the base of the reference hetero junction bipolar transistor is connected to the external reference input terminal of the compound semiconductor integrated circuit to which the predetermined reference base current from the reference current generating circuit of the bias circuit of the silicon semiconductor integrated circuit is supplied, and the reference current flowing in the collector of the reference hetero junction bipolar transistor and the external reference output terminal is supplied to the input terminal of the first current mirror of the bias circuit of the silicon semiconductor integrated circuit.

* * * * *